(12) United States Patent
Salinas et al.

(10) Patent No.: US 7,518,854 B2
(45) Date of Patent: Apr. 14, 2009

(54) REMOVABLE STORAGE MODULES

(75) Inventors: Everett R. Salinas, Pasadena, TX (US); Herbert J. Tanzer, Woodland Park, CO (US); Ralph M. Tusler, Monument, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 11/836,263

(22) Filed: Aug. 9, 2007

(65) Prior Publication Data
US 2007/0274053 A1 Nov. 29, 2007

Related U.S. Application Data

(62) Division of application No. 10/954,685, filed on Sep. 30, 2004, now Pat. No. 7,272,012.

(51) Int. Cl.
*H05K 7/00* (2006.01)
(52) U.S. Cl. .............................. 361/679.37; 361/679.33; 312/223.1

(58) Field of Classification Search ................. 361/685, 361/727; 312/223.1
See application file for complete search history.

(56) References Cited

U.S. PATENT DOCUMENTS

| | | | | |
|---|---|---|---|---|
| 6,064,569 A * | 5/2000 | Sands et al. | ................. | 361/685 |
| 6,231,224 B1 * | 5/2001 | Gamble et al. | ............. | 362/551 |
| 6,317,329 B1 * | 11/2001 | Dowdy et al. | ............... | 361/725 |
| 6,560,098 B1 * | 5/2003 | Beinor et al. | ............... | 361/685 |
| 6,876,547 B2 * | 4/2005 | McAlister | ................... | 361/685 |
| 6,952,341 B2 * | 10/2005 | Hidaka et al. | ............... | 361/685 |

* cited by examiner

*Primary Examiner*—Lisa Lea-Edmonds
*Assistant Examiner*—Ingrid Wright (57) ABSTRACT

In one embodiment, a removable storage module for use in a module cage includes a latch mechanism including: a latch arm that is used to rotate the mechanism about an axis, and a top portion that includes at least one latch tooth and a paddle member, the latch tooth comprising a first surface that is adapted to abut a rear side of a first flange of the cage during insertion of the module and a second surface that is adapted to abut a second flange of the cage during removal of the module, the paddle member being adapted to abut a front side of the first flange during removal of the module.

14 Claims, 10 Drawing Sheets

REMOVABLE STORAGE MODULES

CROSS-REFERENCE TO RELATED APPLICATION

This application is a divisional of copending U.S. nonprovisional patent application entitled "Removable Storage Modules," having Ser. No. 10/954,685 and filed Sep. 30, 2004, which is entirely incorporated herein by reference.

BACKGROUND

Many mass storage systems comprise housings that contain multiple removable modules that, in turn, contain storage media. For example, a rack enclosure may comprise a plurality of housings arranged in a vertically-stacked orientation with each housing comprising a plurality of drive cages, each cage being adapted to receive one or more removable drive modules that comprise multiple hard disks.

In designing a mass storage system, such as that described above, a significant amount of attention must be devoted to the design of the removable modules. For example, the configuration and dimensions of the removable module (i.e., "form factor") are important in achieving high storage density. In addition, an insertion and removal mechanism typically is provided for the modules that enables a user to easily insert the modules into and remove the modules out from their cage. Furthermore, it may in some cases, be desirable to provide a mechanism for preventing modules of a certain type from being inserted into given bays of a cage that are adapted to receive modules of a different type.

SUMMARY

In one embodiment, a removable storage module includes a bezel, and opposed first and second rails that extend from the bezel, the first rail including a key system component that is adapted to prevent full insertion of the module into a bay of a module cage so as to protect a connector of at least one of the module and the cage.

In another embodiment, a removable storage module for use in a module cage includes a bezel including a latch mechanism provided at a front of the bezel that is used to insert and remove the module, the latch mechanism including: an axis about which the mechanism can rotate, a latch arm extends outward from the axis that is used to rotate the mechanism about the axis, and a top portion that includes at least one latch tooth and a paddle member, the latch tooth comprising a first surface that is adapted to abut a rear side of a first flange of the cage during insertion of the module and a second surface that is adapted to abut a second flange of the cage during removal of the module, the paddle member being adapted to abut a front side of the first flange during removal of the module.

In a further embodiment, a removable storage module includes a bezel, and a rail that extends from the bezel, the rail having a proximal end and a distal end, the rail including a light pipe that extends along the rail from its distal end to its proximal end and through the bezel so as to provide an indicator at a front of the bezel, the rail including fingers at the distal end of the rail adjacent the light pipe, the fingers defining a pocket in which a light source within a cage into which the module is inserted can extend so as to position the light source in close proximity to the light pipe.

BRIEF DESCRIPTION OF THE DRAWINGS

The disclosed removable storage modules can be better understood with reference to the following drawings. The components in the drawings are not necessarily to scale.

DETAILED DESCRIPTION

As is described above, removable modules for mass storage systems are carefully designed to achieve various goals including, for instance, attaining high storage density, facilitating easy insertion and removal of the modules, and preventing modules from being improperly inserted (e.g., into the wrong bay of a module cage). Described in the following are removable storage modules that achieve those goals, as well as others.

Figure 1:
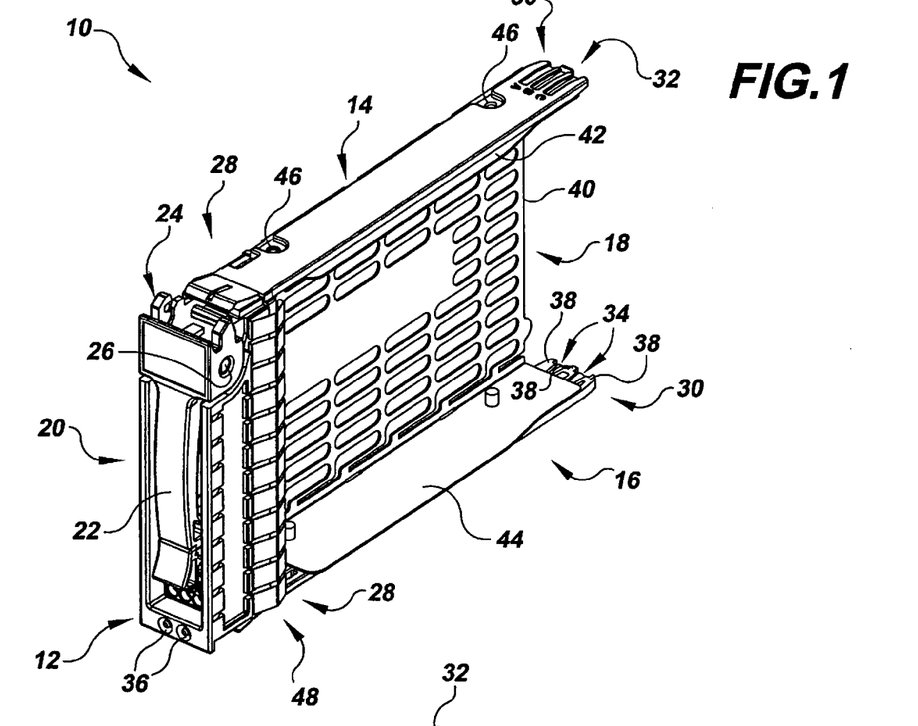
FIG. 1 is a front perspective view of an example embodiment of a removable storage module.

Referring now in more detail to the drawings, in which like numerals indicate corresponding parts throughout the several views, FIG. 1 illustrates an embodiment of a removable storage carrier 10. By way of example, the removable storage carrier 10 is configured to receive a disk drive (not shown in FIG. 1 for purposes of clarity). In such a case, the module 10 may be referred to as a removable drive module. Although a drive module implementation has been explicitly identified, other implementations are possible that employ different forms of storage media. For convenience, the removable storage carrier 10 will be referred to herein as a removable storage "module" given that the carrier may comprise a drive module (not illustrated in most figures for purposes of clarity) in which case the term storage module may be more appropriate. However, it is noted that the removable storage carrier is capable of separate manufacture and use.

As is apparent from FIG. 1, the module 10 includes a bezel 12 that is connected to opposed rails including a first or top rail 14 and a second or bottom rail 16. Extending between the rails is a cover 18 that, for example, protects a circuit assembly of the storage device (e.g., disk drive) that mounts between the rails 14, 16. The bezel 12 comprises a latch mechanism 20 that includes a latch arm 22 and cam teeth 24. The latch mechanism 20 can be rotated about an axis 26 so as to place the cam teeth 24 into abutment with surfaces of a module cage into which the module 10 is to be inserted, or from which the module is to be removed. The configuration and operation of the latch mechanism 20 is described in greater detail below in relation to FIGS. 8-11.

The rails 14, 16 comprise proximal and distal ends 28 and 30, and connect to the bezel adjacent the proximal ends. Provided at the distal end 30 of the top rail 14 is a key system component that, as is described in greater detail in relation to FIGS. 2-7, is used to prevent improper insertion of the module 10 into a cage. In the embodiment shown in FIG. 1, the key system component includes key slots 32 that extend along a longitudinal direction of the rail 14 (see FIG. 1). As is indicated in that figure, three such key slots 32 are provided in the top rail 14 of the illustrated embodiment.

Extending along the length of the bottom rail 16 are light pipes 34. More particularly, the light pipes 34 extend from the distal end 30 of the bottom rail 16 to the front of the bezel 12 so as to transmit light generated by a light source (e.g., light emitting diode (LED); see FIG. 12) provided within the cage in which the module 10 is inserted to indicators 36 provided in the bezel. The light pipes 34 are recessed at the distal end 30 of the bottom rail 16 relative to fingers 38 that extend from the rail. As is described below in relation to FIG. 12, the fingers 38 are adapted to abut a connector plane accessible within the cage before the light pipes 34 make contact with their respective light sources. With this arrangement, the fingers 38 protect the light sources from damage that could be caused from contact with the light pipes 34.

The cover 18 includes a central portion 40 and two opposed side portions 42 and 44, to which the rails 14 and 16 attach, respectively. By way of example, the cover 18 is formed from a single piece of material, such as sheet metal. As is shown in FIG. 1, the rails 14, 16 can be attached to the side portions 42, 44, and to the storage device to be mounted between the rails, using threaded fasteners, such as screws 46.

As is further indicated in FIG. 1, the module 10 may comprise an electromagnetic interference (EMI) shield 48 that is positioned between the bezel 12 and the rails 14, 16. When the module 10 is inserted within a cage, the shield 48 fills gaps between the module and the cage walls and/or other modules within the cage so as to reduce the amount of EMI that is emitted from the cage. An example of a suitable EMI shield is described in commonly-assigned U.S. patent application Ser. No. 10/947,101, which is hereby incorporated by reference for all that it discloses.

Figure 2:
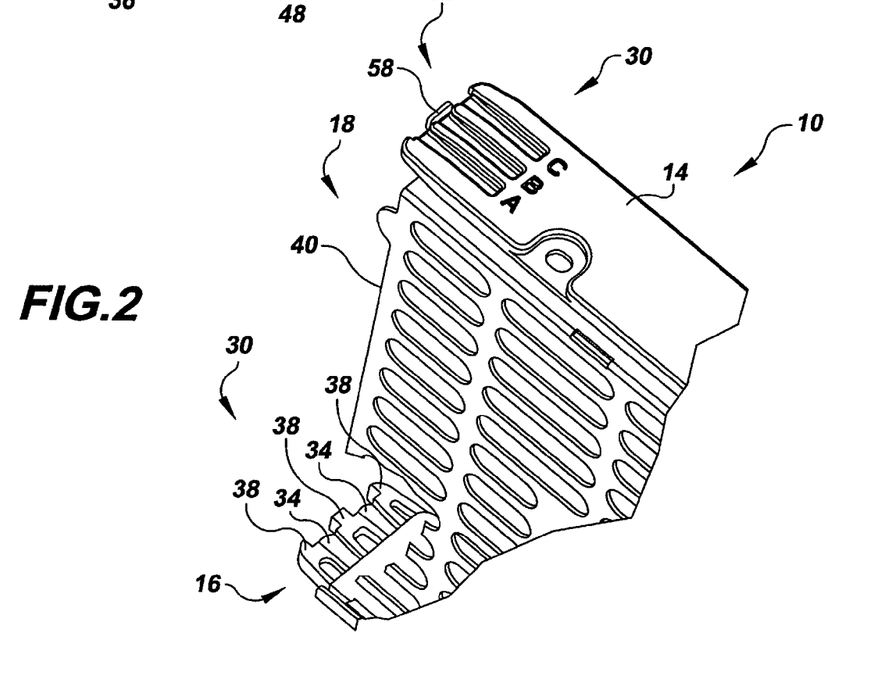
FIG. 2 is a detail view of key slots provided in a rail of the module shown in FIG. 1.

Referring next to FIG. 2, illustrated are the key slots 32 positioned at the distal end 30 of the top rail 14. In this embodiment, three key slots 32, labeled "A," "B," and "C" are provided. As is noted above, these key slots 32 comprise part of a key system that is used to prevent improper insertion of a module 10 into a cage. More particularly, the key system is used to control which modules 10 can be fully inserted into which bays of a module cage to prevent contact between non-mating connectors of the connector plane within the cage and the connectors of the module storage devices of the modules. Operating in this manner, the key system prevents damage to the connector plane connectors and/or the device connectors by preventing their contact with each other.

Figure 3:
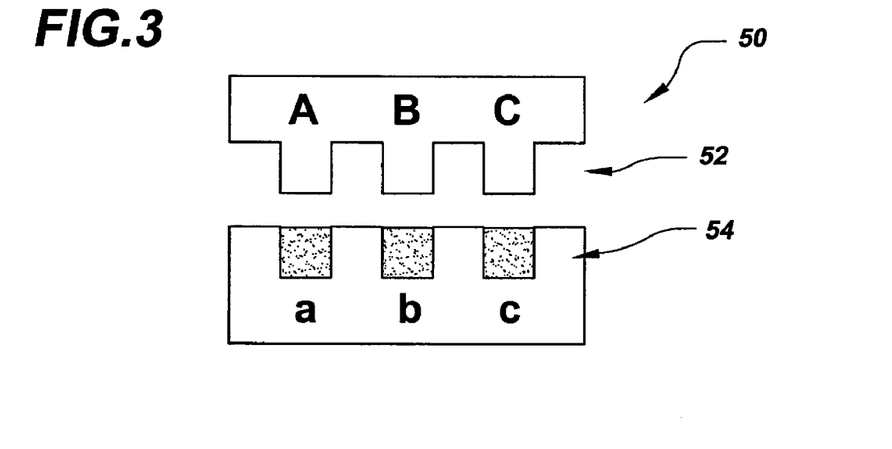
FIG. 3 is a schematic view of an embodiment of a key system that can be used to control which removable storage modules can be fully inserted into which bays of a module cage.
Figure 4:
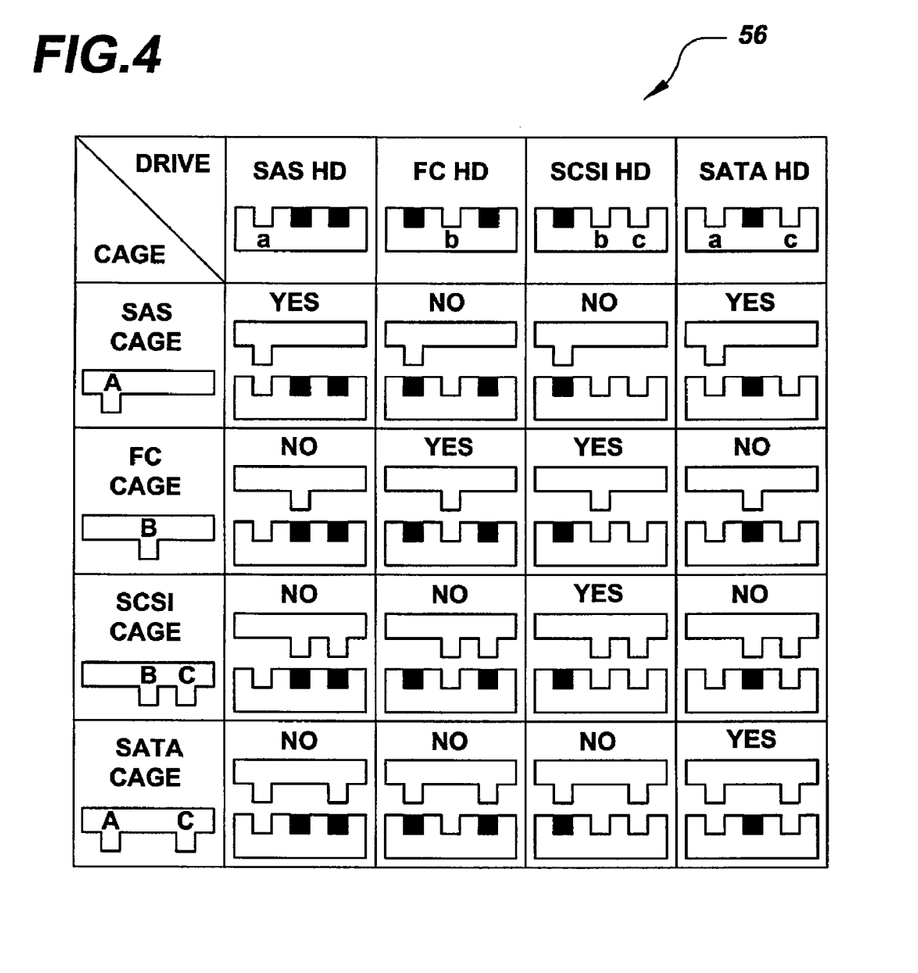
FIG. 4 is a table that associates module key slot configuration with cage key configuration in an example key system.
Figure 5A:
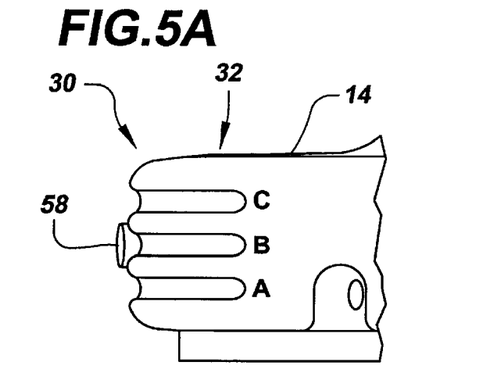
FIGS. 5A-5D are detail views of various embodiments of key stop configurations that are used to prevent keys from entering key slots.
Figure 5B:
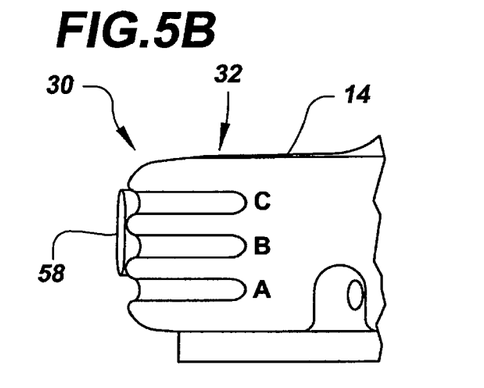
Figure 5C:
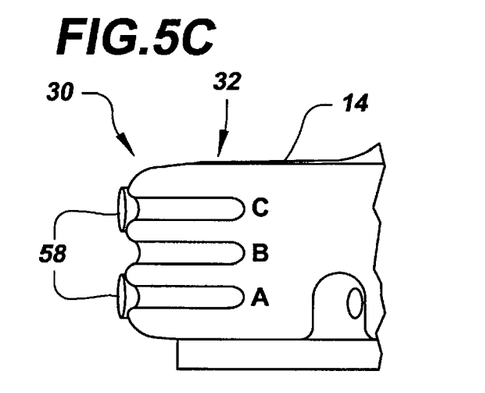
Figure 5D:
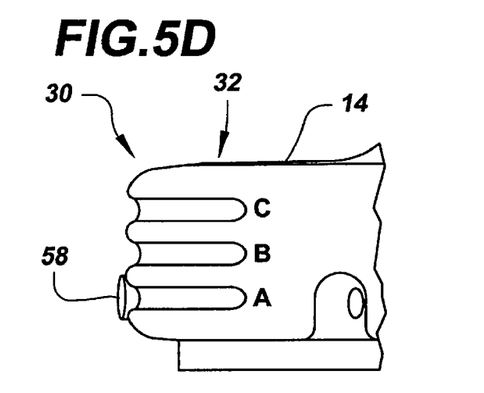

FIGS. 3 and 4 conceptually illustrate an example key system 50. With reference first to FIG. 3, the system 50 comprises two main components: keys 52 and key slots 54 that are adapted to receive the keys when a removable storage module is inserted into a module cage. As is noted above, the key slots 54 can be provided on a rail of the storage module (see keys 32, FIG. 2). In such a case, the keys are provided within the module cage. In an alternative arrangement, however, the location of the keys and key slots may be reversed such that the module rail comprises the keys and the cage comprises the key slots.

With the key system 50, full insertion of a module, and therefore contact between the module's connector and a connector of a connector plane within the cage, can be prevented by blocking one or more of the key slots 54 for which a key 52 exists. This is depicted in FIG. 3 with gray scale squares positioned within the key slots 54. By selectively blocking particular key slots 54 and providing particular keys 52, full insertion of the module can be controlled. Specifically, by providing the module with a particular number and configuration of open key slots 54 (or keys 52), and providing a bay with a particular number and configuration of keys 52 (or key slots 54), certain modules can be prevented from being fully inserted into certain bays of a module cage.

Implementation of the key system 50 enables the same module (i.e., cage, rails, and cover) to be usable with storage devices having different types of connectors, which are associated with different types of data communication formats. Example communication formats include small computer system interface (SCSI), serial-attached SCSI (SAS), fiber channel (FC), and serial advanced technology attachment (SATA). Each of these formats uses a different type of connector, except for SAS and SATA. Therefore, if a given storage device, such as a hard drive, communicates using SCSI, its module should be prevented from fully inserting into a bay that, for example, comprises a SAS connector. Such insertion can be prevented by providing key slots 54 on the module that do not match, i.e., that will not receive, the keys 52 of the bay.

FIG. 4 provides a table 56 that associates key and key slot configurations of an example key system implementation. In the table 56, various cage types are identified in the table rows, and hard drive types (i.e., hard drives using different communication formats) are identified in the table columns. More specifically, the table 56 crosses each of a SAS cage, an FC cage, a SCSI cage, and a SATA cage against each of a SAS hard drive ("HD"), an FC hard drive, a SCSI hard drive, and a SATA hard drive. As is apparent from the table 56, each type of cage comprises a different number of keys and/or a different key configuration. For example, the SAS cage is provided only with the "A" key, and the SCSI cage is provided with keys "B" and "C." In similar manner, each type of drive uses a module that comprises a different number of open key slots and/or a different key slot configuration. For example, only the "b" slot is open for the FC drive module (i.e., slots "a" and "c" are blocked), while slots "a" and "c" are open for the SATA drive module (i.e., slot "b" is blocked).

The acceptable combinations of drives and cages can be determined with reference to the table 56. Assume for instance that the user has a SAS drive that the user wishes to insert into a cage. Referring to the table, it is apparent that the SAS drive, in this embodiment, only comprises one open slot, i.e., slot "a." Because of that, the drive can only be inserted into a cage bay that does not comprise keys "B" and/or "C"

(because slots "b" and "c" of the drive module are blocked). By following down the SAS drive column (the first column in table 56), it is apparent that the SAS drive can only be inserted in a SAS cage.

It may be possible to insert a given type of drive in more than one type of cage. For example, as indicated in table 56, a SATA drive module can be inserted into a SATA cage, as well as a SAS cage. Although insertion of the SATA drive into a SAS cage will not enable the full functionality of the SAS format, such insertion will not damage the connectors of the drive or cage and is therefore permissible. Notably, the reverse arrangement is not possible. That is, a SAS drive cannot be fully inserted into a SATA cage. This is because, although the respective connectors of a SAS drive and a SATA cage will mate, operation of the drive will be problematic with such a pairing.

As is further apparent from the table 56, the SCSI drive module has key slots "b" and "c" open and therefore can receive the "B" key of an FC cage, even though the SCSI drive connector cannot mate with an FC connector. This key/key slot match between SCSI drive modules and FC cages is deemed permissible, however, given that such a high degree of resistance would be encountered during an attempt to insert a SCSI drive module into an FC cage that the user would likely recognize that the drive module is not intended for insertion into that particular cage. The connectors of the drive and cage are not likely to be damaged from such an attempt (barring an attempt to force the module into the cage against the resistance) given the configuration and robustness of the SCSI and FC connectors.

Due to the above-described key system 50, the same module design can be used for multiple types of storage devices (e.g., hard drives), including those that have not yet been developed. Therefore, the key system 50 enables reuse of the same module design for many different implementations, thereby saving the time and effort that may otherwise would have been required to develop a new design for each type of storage device that is or becomes available.

Blocking of the rail key slots can be achieved in various ways. With reference to FIGS. 3 and 5A-5D, the key slots 32 are shown blocked with stops 58 that close off entrances to the key slots with which the stops are aligned. For example, in the configuration shown in FIG. 5A (e.g., a SATA drive), key slot "b" is blocked by a single stop 58. In the configuration shown in FIG. 5B, key slots "b" and "c" are blocked by a single stop 58 (e.g., a SAS drive). In the configuration shown in FIG. 5C, key slots "a" and "c" are blocked by separate stops 58 (e.g., an FC drive). Finally, in the configuration shown in FIG. 5D, key slot "a" is blocked (e.g., SCSI drive).

Figure 6:
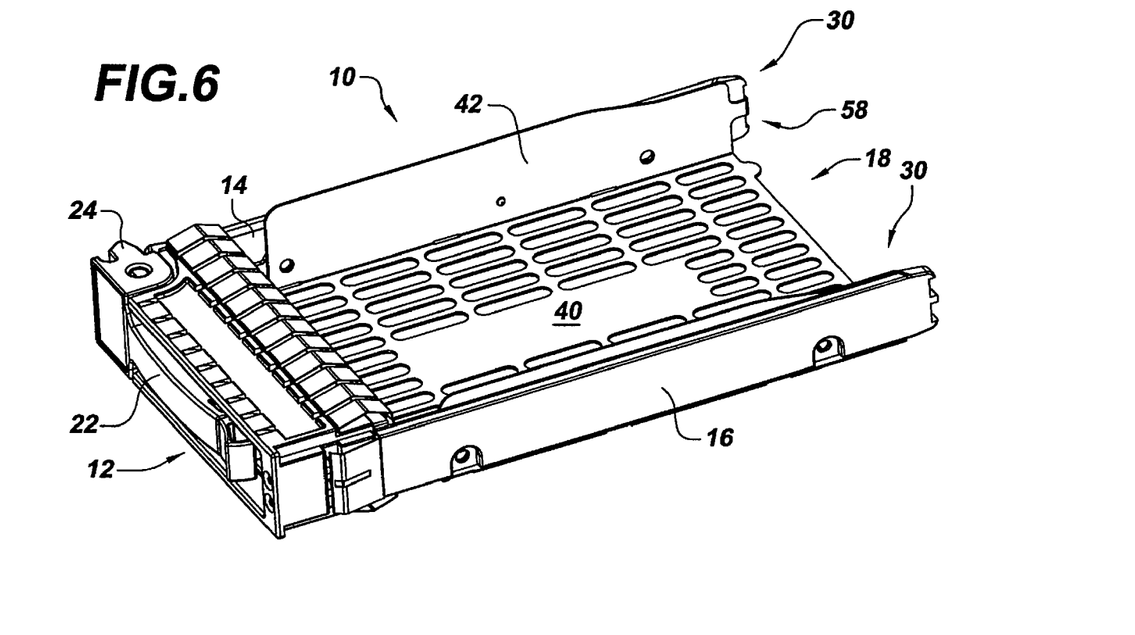
FIG. 6 is a bottom perspective view of the module shown in FIG. 1, illustrating an example key stop that extends from a cover of the module.

FIG. 6 illustrates an example configuration for a stop 58. As is shown in that figure, the stop 58 comprises a tang that extends out from the top side portion 42 of the module cover 18. By way of example, the stop 58 is integrally formed with the cover 18 such that the stop is formed from the same single piece of material (e.g., piece of sheet metal) from which the cover is formed. Although a stop 58 is shown in FIG. 6 as comprising part of the cover 18, other configurations are possible. For example, the "stops" can instead comprise additional material of the rail 14 that fills one or more of the key slots 32. In other words, multiple rails 14 can be constructed having different numbers and/or configurations of key slots. With the system shown in FIGS. 5A-5D and 6, however, the same rail 14 can be used with each drive (or other storage device) type.

Figure 7:
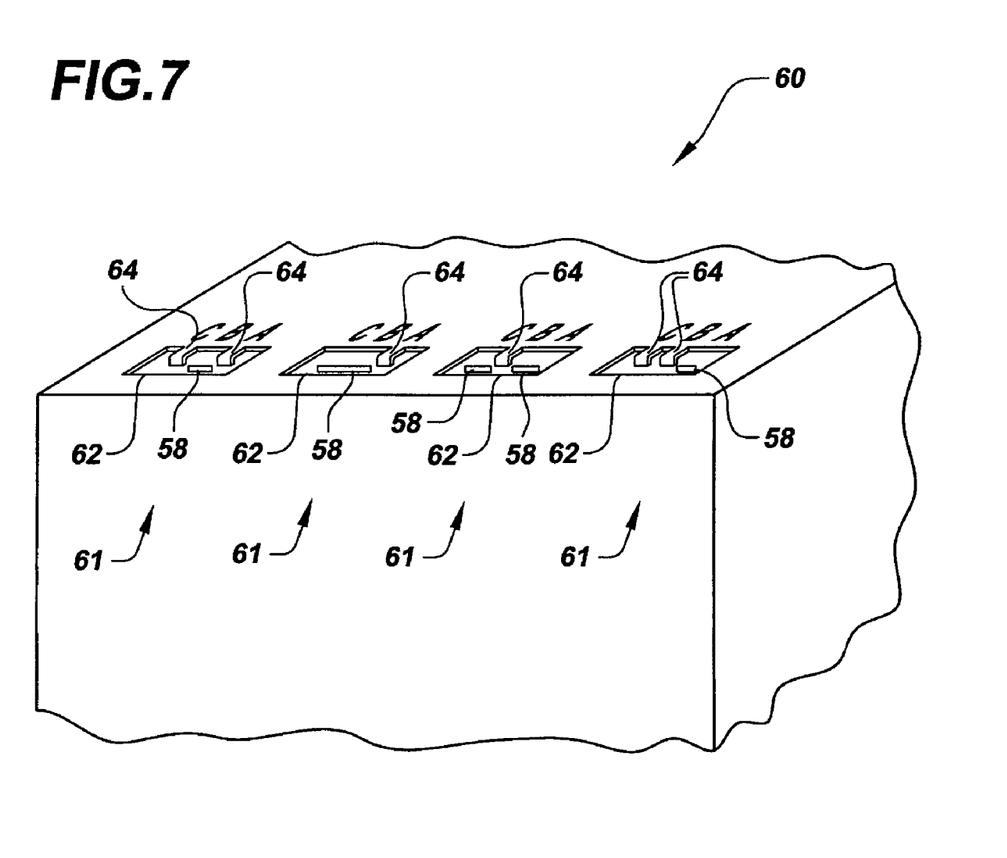
FIG. 7 is a top, rear perspective view of an embodiment of a module cage, illustrating keys of the cage.

Referring next to FIG. 7, illustrated is the rear of a module cage 60. The cage 60 comprises a plurality of bays 61, in this case four bays. At the end of each bay 61 is a cutout 62 from which keys 64, in the form of tines, extend. More particularly, the keys extend 64 down into the interior of the cage 60 so as to be able to align with and be received by open key slots of modules 10 that are inserted into the respective bays. In this example, each of SATA, SAS, FC, and SCSI drive modules have been inserted into SATA, SAS, FC, and SCSI cages, respectively. Because the proper modules 10 have been inserted into the proper bays 61, the stops 58 of the modules do not interfere with passage of the keys 64 into the module key slots.

Figure 8:
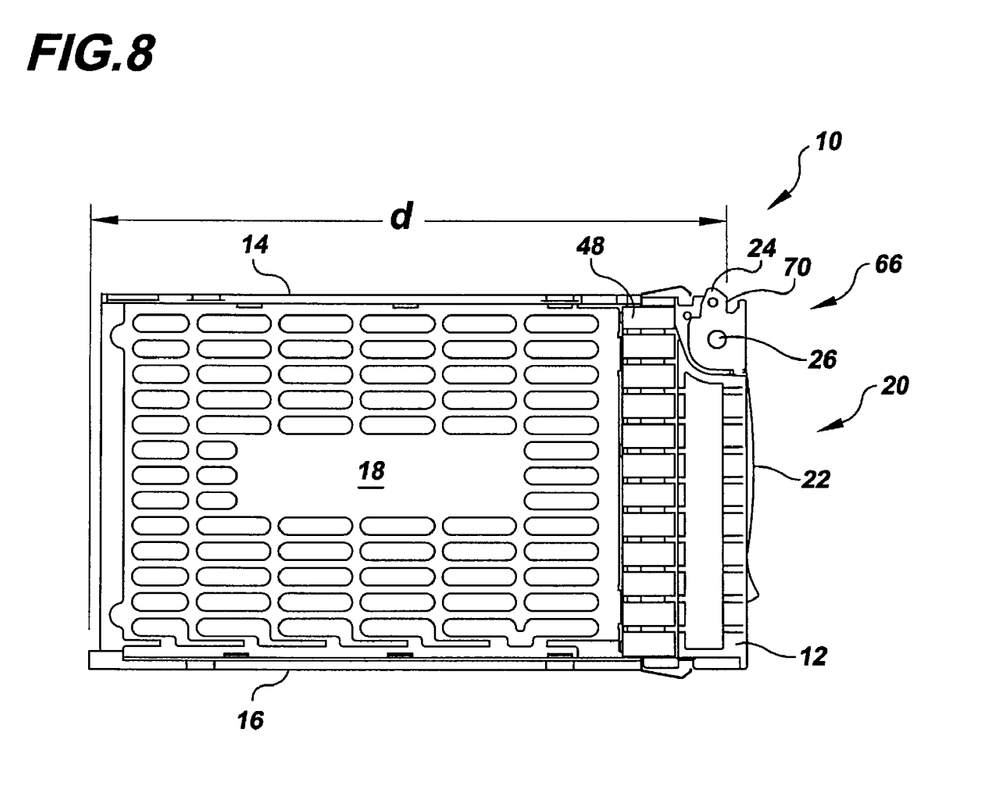
FIG. 8 is a side view of the module shown in FIG. 1, illustrating an embodiment of a latch mechanism of the module.

Referring now to FIG. 8, the module 10 is shown in side view. As is indicated in that figure, the latch mechanism 20 includes a top portion 66 that is positioned at the front, top corner of the module 10. The top portion 66 of the latch mechanism 20 is illustrated in greater detail in FIG. 9.

Figure 9:
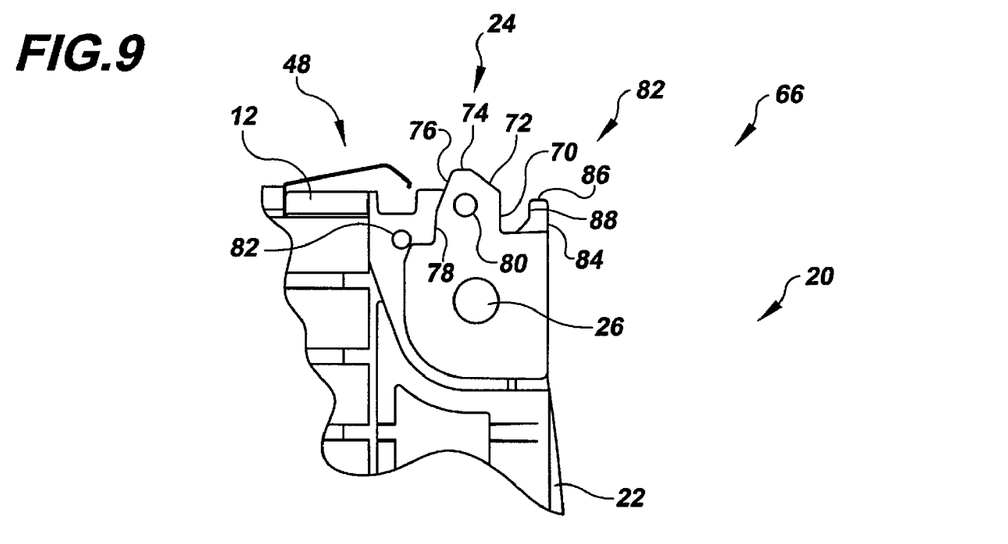
FIG. 9 is a detail view of a portion of the latch mechanism shown in FIG. 8.

With reference to FIG. 9, the top portion 66 includes the latch teeth 24 first identified in FIG. 1. Each latch tooth 24 includes a front vertical surface 70, a front oblique surface 72, a top surface 74, a rear oblique surface 76, and a rear vertical surface 78. As is described in the following, several of those surfaces are used to insert the module 10 into a cage, and/or remove the module from the cage. As is further shown in FIG. 9, the latch teeth 24 include an opening 80 that is adapted to receive a detent 82 that is provided on the bezel 12. As is described in relation to FIGS. 13A and 13B, the opening 80 and detent 82 can be used together to lock the latch arm 22 of the mechanism 20 in an extended position.

In addition to the latch teeth 24, the top portion 66 of the latch mechanism 20 includes a paddle member 82 that includes a front vertical surface 84, a top surface 86, and a rear vertical surface 88. As is described in relation to FIGS. 11A-11F, the paddle member 82 aids in the removal of the module 10 from a cage.

Figure 10:
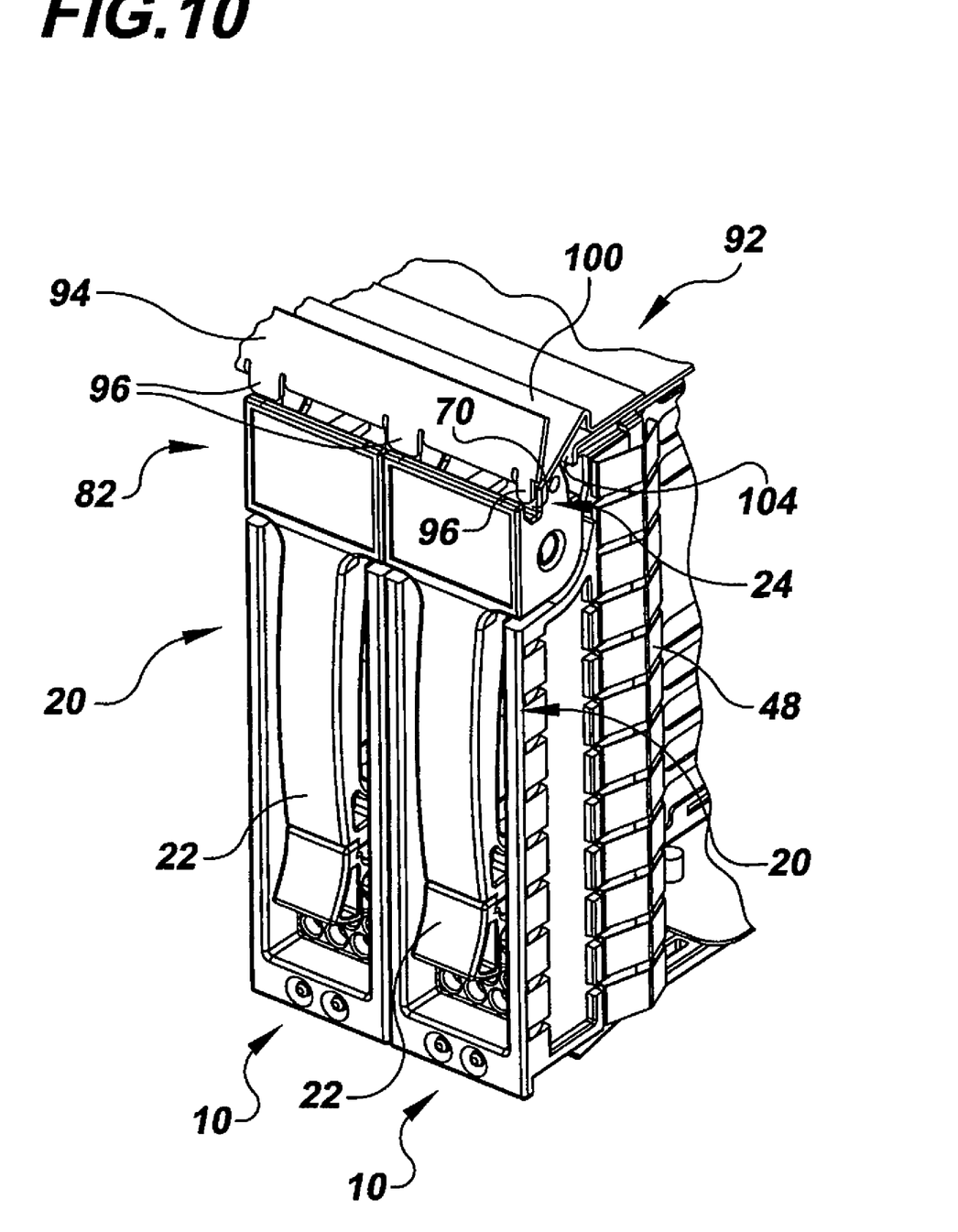
FIG. 10 is a front perspective view of modules positioned within a module cage.

Referring next to FIG. 10, illustrated are removable storage modules 10 inserted into a module cage 92. As is apparent from FIG. 10, the latch keys 24 of the latch mechanisms 20 contact a first or front flange 94 that is positioned at an entrance of the cage 92. More specifically, the front surfaces 70 of the latch teeth 24 abut tines 96 that extend downward from the front flange 94. As is described in relation to FIGS. 11A-11F, the latch teeth 24 are urged against the tines 96 during insertion of the module into the cage 92.

As is also shown in FIG. 9, a spring member 100 of the cage 92 is positioned inward of the front flange 94 that also contacts the latch teeth 24. In particular, the spring member 100 applies a downward force on the front oblique surfaces 72 of the teeth 24 (FIG. 9) so as to, thereby, apply a downward force to the entire module 10. This downward force stabilizes the module 10 during operation of the storage device 90 (e.g., hard drive) that it comprises.

In addition to the front flange 94 and the spring members 100, the cage further includes a second or rear flange that is positioned inward of the front flange and that is defined by a plurality of lines 104. As is described in relation to FIGS. 11A-11F, those tines 104 aid in removal of the modules 10 from the cage 92.

Operation of the latch mechanism 20 will now be described in relation to schematic FIGS. 11A-11F. Beginning with FIG. 11A, a module (represented by its latch mechanism 20) is fully inserted in the cage 92 so that the latch teeth 24 contact the front flange 94 (i.e., the tines 96) in the manner depicted in FIG. 10. To remove the drive from the cage 92, the latch arm 22 is rotated about its axis 26 in the direction indicated by arrow 102 in FIG. 11B. When that action is performed, the top portion 66 of the mechanism 20 is rotated such that the latch teeth 24 likewise rotate so that the rear oblique surfaces 76 of the teeth engage the second flange (i.e., tines 104) of the cage 92. As rotation of the latch arm 22 is continued, the rear oblique surfaces 76 are pressed against the tine 104 of the second flange so as to move the module in the direction shown by arrow 106, as indicated in FIG. 11C. Accordingly, the module is pushed outward from the cage 92 so as to separate the module's connector from the associated connector of the connector plane within the cage 92.

Figure 11A:
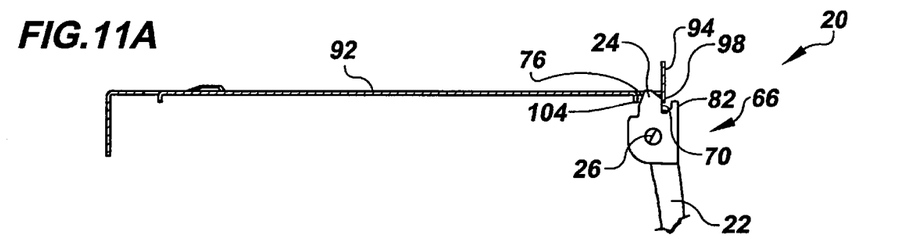
FIGS. 11A-11F are schematic views that illustrate operation of the latch mechanism shown in FIGS. 9 and 10 during removal of a module from its cage.
Figure 11B:
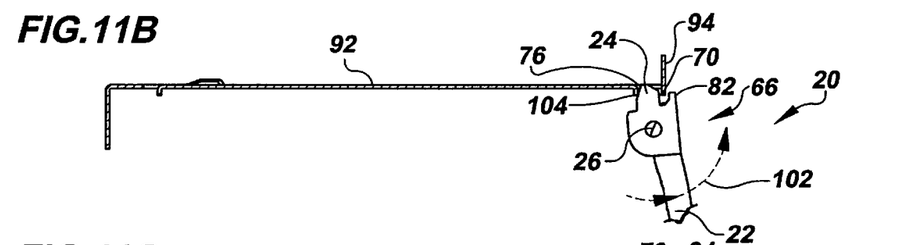
Figure 11C:
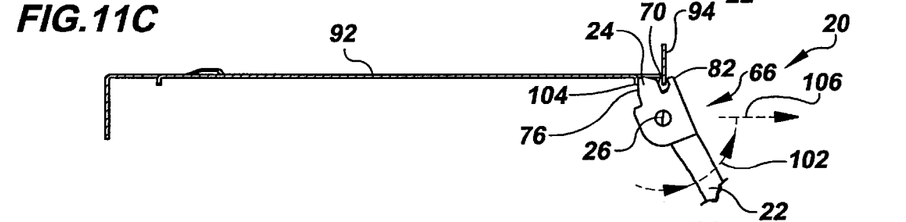
Figure 11D:
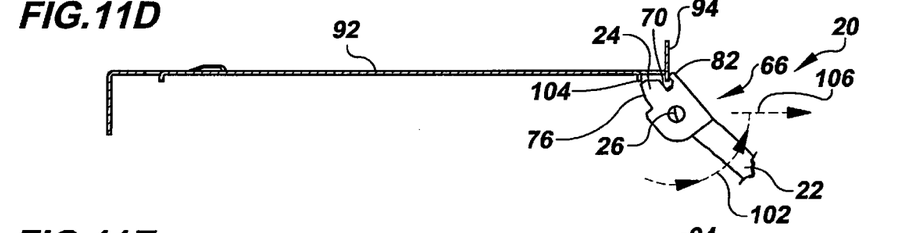
Figure 11E:
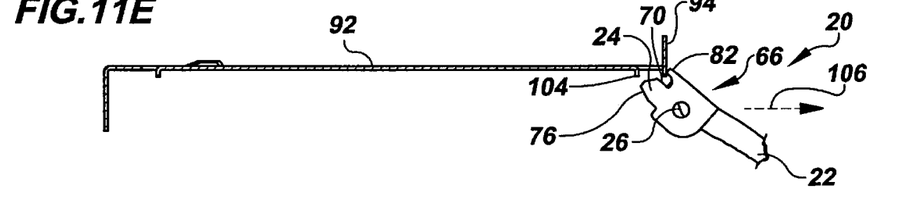
Figure 11F:
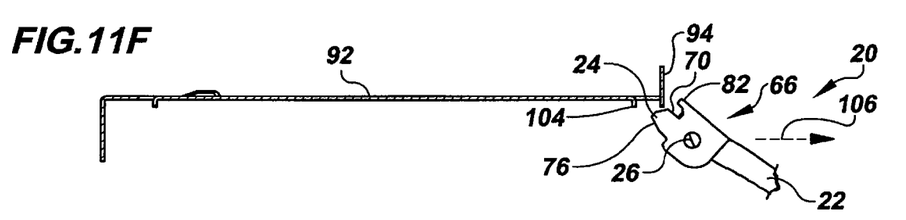

Referring next to FIG. 11D, continued rotation of the latch arm 22 causes the rear oblique surfaces 76 to separate from the tines 104 such that the rear oblique surfaces, and the latch teeth 24 on which they are provided, no longer contribute to module removal. At this point, however, the paddle member 82 engages the flange 94 to contribute to the module removal process. Specifically, a corner defined by the rear vertical surface 88 and the top surface 86 of the paddle 82 (see FIG. 9) is urged against the front surface of the flange 94 and tine 96. As the latch arm 22 is further rotated, as is indicated in FIG. 11E, the module is moved farther in the direction indicated by arrow 106 and, therefore, is further removed from the cage 92. Finally, the module is moved to the point at which the connector of the module is completely disengaged from its associated connector in the cage 92, and the module can be manually withdrawn from the cage by pulling outward on the latch arm 22 in the direction of arrow 106 in FIG. 11F.

As can be appreciated from the foregoing description, the latch mechanism 20 aids the user in removing a module on which the mechanism is provided. More particularly, the mechanism 20 provides the user with a mechanical advantage that enables removal of the module with relatively little effort. Notably, the latch mechanism 20 further aids the user in inserting the module in its drive. This process generally comprises performing the steps shown in FIGS. 11A-11F in reverse order. Accordingly, beginning with FIGS. 11F-11D, the module is manually inserted into the cage 92 (in the direction opposite arrow 106) with the latch arm 22 in the extended position until the latch teeth 24 are positioned between the first and second flanges 92, 104 (see FIG. 11D). At that point, the latch arm 22 can be rotated in a direction opposite of arrow 102. With such rotation of the arm 22, the latch teeth 24 likewise rotate so and come into contact with the rear surface of the flange 94 and its tines 96. Continued rotation urges the front vertical surfaces 70 (see FIG. 9) of the teeth 24 against the flange 94 which, in turn, urges the module into the cage 92 and the module connector into contact with the associated connector of the cage connector plane. Once the position illustrated in FIG. 11A has been achieved, the module is fully inserted into the cage and the module connector is fully engaged with its associated connector of the cage connector plane.

Figure 12:
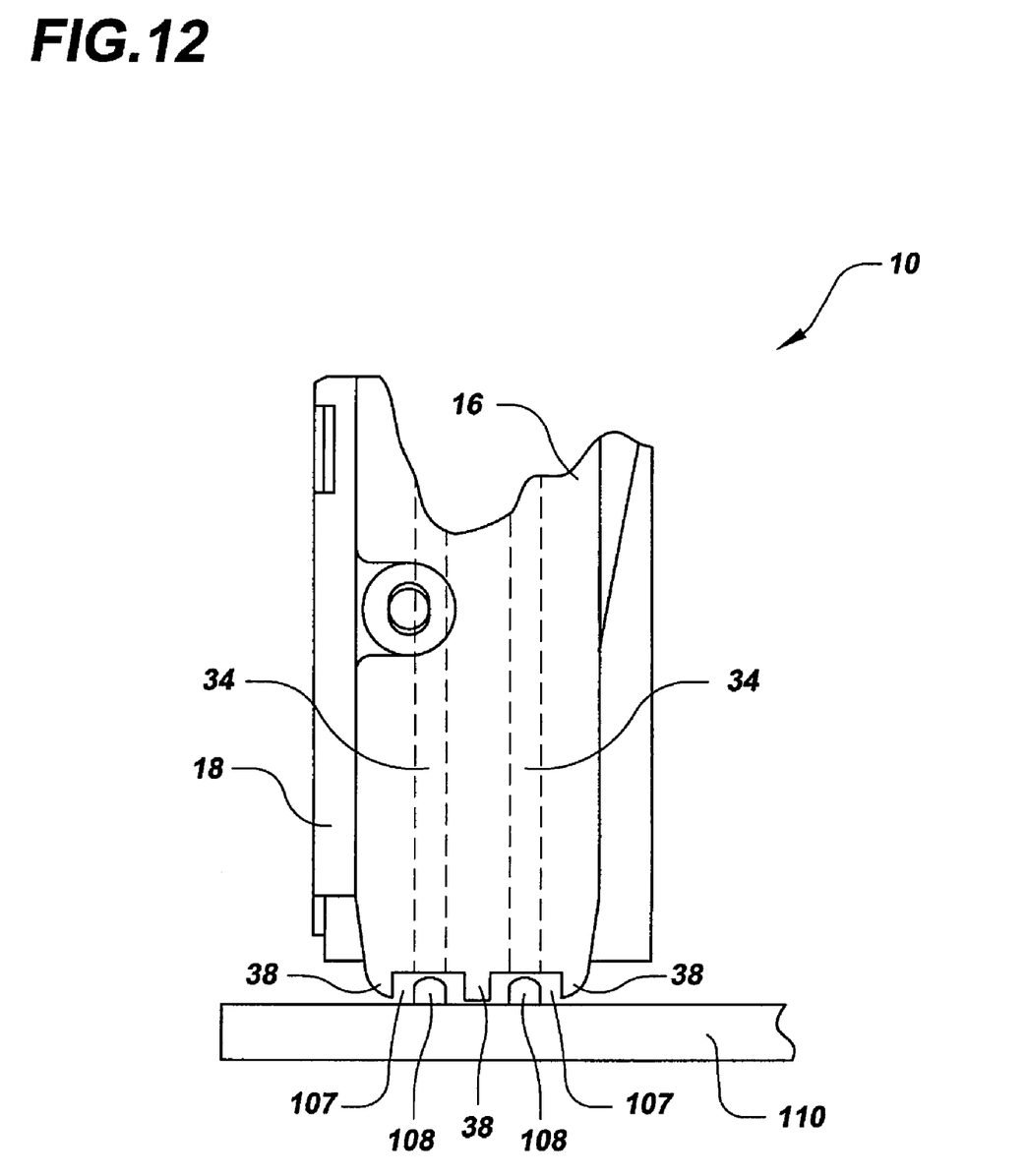
FIG. 12 is a partial bottom view of a module that is fully inserted within a module cage.

When the module is fully inserted as indicated in FIG. 11A, the module light pipes closely align with the light sources within cage. Such an arrangement is illustrated in FIG. 12. As is shown in that figure, the ends of the light pipes 34 are recessed relative to the fingers 38 of the rail 16, which form pockets 107 in which light sources 108 mounted to the connector plane 110 of the cage may extend. With such an arrangement, the light sources 108 can be placed in close proximity to the ends of the light pipes 34, as indicated in FIG. 12. As noted above, the rail 16 and its fingers 38 are sized and configured so as to prevent contact between the light pipes 34 and the light sources 108. More specifically, the rail 16 and its fingers are sized to ensure that the horizontal distance d, shown in FIG. 8, from the front vertical surfaces 70 of the latch teeth 24 (which abuts the flange 94 at the entrance of the cage 92 as is shown in FIG. 10) to the connector plane 110 is controlled such that a small amount of clearance (e.g., 0.009 inches) is provided between the fingers and the connector plane. With such an arrangement, the light pipes 34 will not contact the light sources 108. Notably, even if the module 10 is forced into the cage so that the rail 16 contacts the connector plane 110, the fingers 38 will abut the connector plane before contact can be made between the light pipes 34 and the light sources 108.

In addition to protecting the light pipes 34 and light sources 108, the distance d is selected so as to enable the same storage module or carrier to be used with various different storage devices. As is known in the art, different types of storage devices have different configurations in terms of the positioning of the device connectors. For example, the positioning of the connectors of fiber channel and SCSI-based devices differs from the positioning of the connectors of SATA and SAS-based devices. Because of this difference, storage carriers are specifically configured for one or the other of these dimensional states. However, the inventors have determined that, if the distance d is selected correctly, a single carrier may be used for multiple different storage devices, including each of fiber channel, SCSI, SATA, and SAS-based storage devices.

Figure 14:
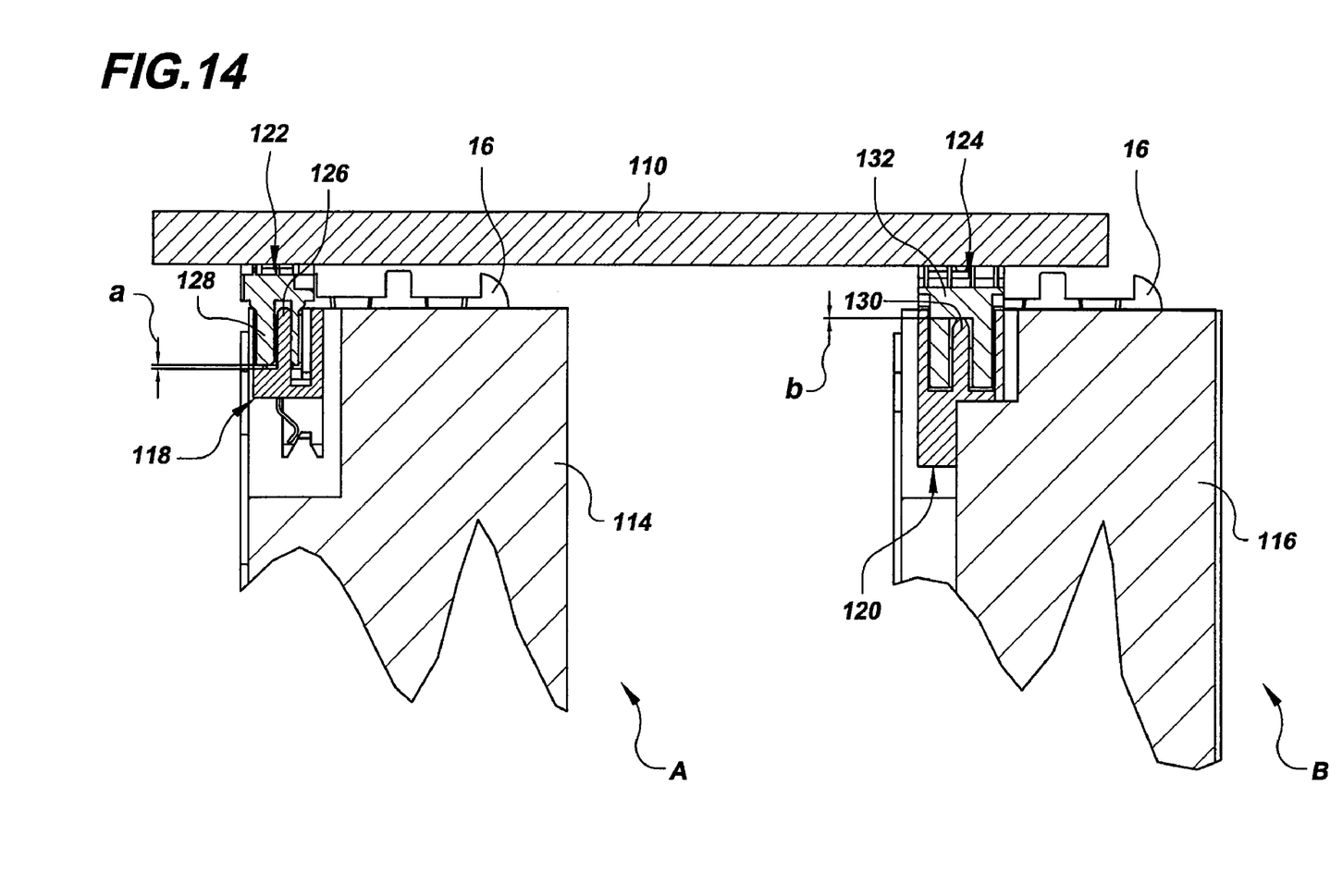
FIG. 14 is a partial cut-away view of an embodiment of a connection arrangement for removable storage modules having different types of storage devices.

Such capability is illustrated in FIG. 14. Illustrated in this figure are two removable storage modules A and B, each comprising a storage device 114, 116, respectively. The module A comprises a SATA or SAS connector 118, while module B comprises a fiber channel or SCSI connector 120. Those connectors 118, 120 are shown interfacing with mating connectors 122 and 124, respectively, which are mounted to the connector plane 110. As is apparent from the figure, the SATA/SAS connector 118 and its associated connector plane connector 122 are coupled such that there is a gap or spacing "a" between the housing 126 of the connector 118 and the housing 128 of the connector 122 when the module A is fully inserted inside its module cage (i.e., the latch mechanism 20 is closed). Despite this gap or spacing, adequate contact is maintained between the two connectors 118, 122 so as to enable communication of data between the module A and the device that comprises the connector plane 110.

As is further apparent from FIG. 14, the fiber channel/SCSI connector 120 and the connector plane connector 124 share an interference fit in which the two connectors abut each other, resulting in the gap or spacing "b" between the housing 130 of the connector 120 and the housing 132 of the connector 124 being non-existent (i.e., direct contact) when the module B is fully inserted in its module cage.

With the arrangement described above, the same removable storage carrier (i.e., carrier or module 10) can be used despite the different configurations of the storage devices 114 and 116 and their associated connectors given that the distance d (FIG. 8) has been selected such that adequate coupling is achieved irrespective of whether the device connectors are fiber channel, SCSI, SATA, or SAS connectors. Therefore, the removable storage carrier 10 can be described as accommodating two different dimensional states of the storage devices that it supports. This characteristic increases the flexibility of use of the removable storage carrier 10 and further reduces costs given that only one carrier need be designed, produced, and stocked.

In the specific embodiment illustrated in FIG. 14, the connectors of fiber channel and SCSI-based devices are placed in firm abutment with mating connectors of the connector plane 110. When the distance d is set to facilitate such firm abutment, the connectors of SATA and SAS-based devices are "backed-off" from such firm abutment to provide a spaced configuration, but adequate contact is achieved. Although an interference fit may be considered undesirable in many circumstances, such an arrangement is considered acceptable for fiber channel and SCSI connectors given that they are highly robust, especially when compared to SATA and SAS connectors. By way of example, the distance d can be about 7.143 inches.

Figure 13A:
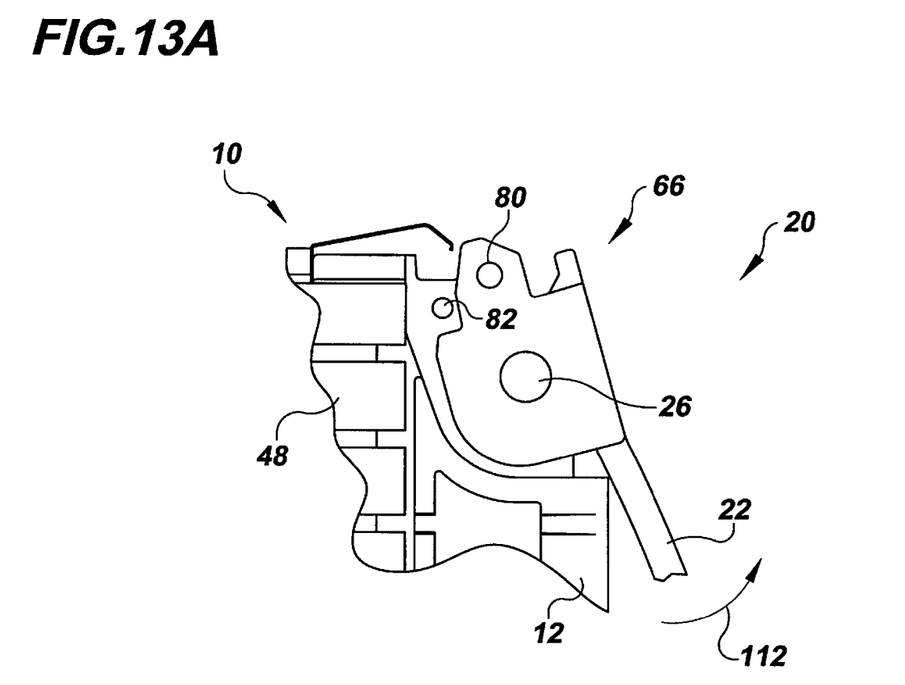
FIGS. 13A and 13B are detail views of a portion of the latch mechanism shown in FIGS. 8 and 9, illustrating locking of a latch arm of the latch mechanism in an extended position.
Figure 13B:
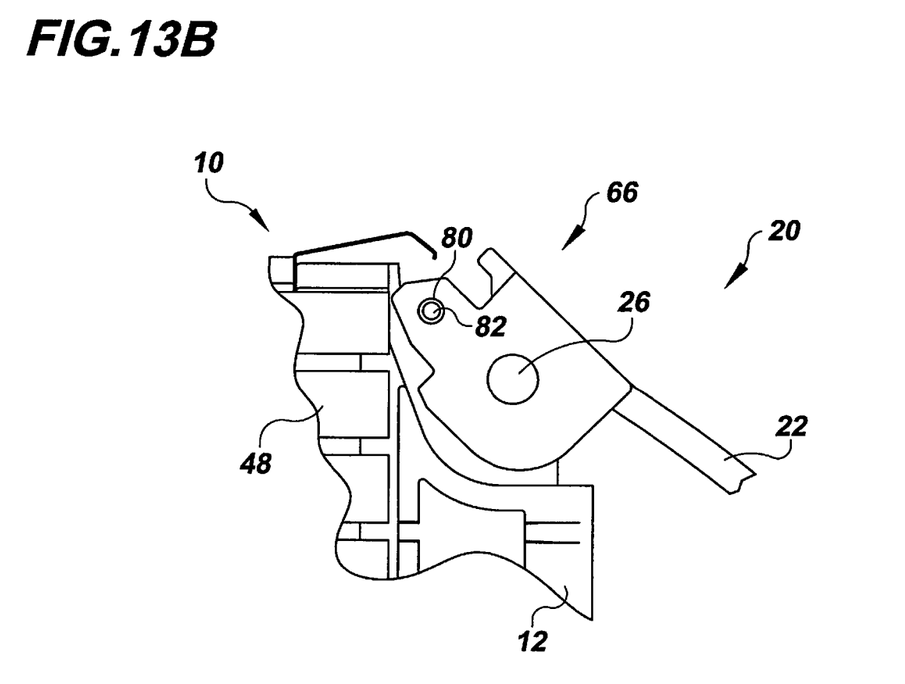

Referring next to FIGS. 13A and 13B, the latch arm 22 of the latch mechanism 20 can optionally be locked in the extended position (indicated in FIG. 11F) to prevent free movement of the latch arm as the module 10 is moved. With reference first to FIG. 13A, as the latch arm 22 is rotated in the direction indicated by arrow 112, the top portion 66 of the latch mechanism 20 rotates about the axis 26 such that the opening 80 provided in the latch tooth 24 moves toward the detent 82 provided in the bezel 12. As that rotation continues, the opening 80 ultimately aligns with the detent 82 so that, as is indicated in FIG. 13B, the detent is received by the opening. In particular, the latch tooth 24 snaps into place over the detent 82 so as to lock the latch arm 22 in the extended position shown in FIG. 13B. While in the locked position, the latch arm 22 is not free to independently rotate. Therefore, as the module 10 is moved from place to place by the user, the latch arm 22 will not loosely swing about its axis 26. The latch arm 22 can be unlocked by the user by rotating the arm in the direction opposite to arrow 112 so as to overcome the force that retains the latch tooth 24 over the detent 82. Depending upon the amount of force that is desired to overcome the locked position, an opening 80 and detent 82 can be provided for only one latch tooth 24 of the latch mechanism 20, or for both of the latch teeth.

What is claimed is:

1. A removable storage module for use in a module cage, comprising:
a bezel including a latch mechanism provided at a front of the bezel that is used to insert and remove the module, the latch mechanism including:
an axis about which the mechanism can rotate;
a latch arm extends outward from the axis that is used to rotate the mechanism about the axis; and
a top portion that includes at least one latch tooth and a paddle member, the latch tooth comprising a front surface that is adapted to press against a rear side of a front flange of the cage during insertion of the module and a rear surface that is adapted to press against a rear flange of the cage during a first stage of removal of the module, the paddle member comprising a rear surface that is adapted to press against a front side of the front flange during a second stage of removal of the module.

2. The module of claim 1, wherein the top portion of the latch mechanism includes two opposed latch teeth.

3. The module of claim 1, wherein the front surface of the latch tooth of the latch mechanism comprises a front vertical surface.

4. The module of claim 3, wherein the rear surface of the latch tooth of the latch mechanism comprises a rear oblique surface.

5. The module of claim 4, wherein the rear surface of the latch tooth of the latch mechanism is adapted to contact a spring member of the cage that stabilizes the module during its use.

6. The module of claim 1, wherein the bezel further includes a detent and the latch tooth of the latch mechanism includes an opening that is adapted to receive the detent such that the latch mechanism locks in place when the detent is received within the opening when the latch arm is placed in a fully extended position.

7. A mass storage system, comprising:
a removable storage module including a latch mechanism having an axis about which the mechanism can rotate, a latch arm that extends outward from the axis that is used to rotate the mechanism about the axis, and a top portion that includes a latch tooth and a paddle member, the latch tooth comprising a front surface that is adapted to aid in insertion of the module into a cage and a rear surface that is adapted to aid in removal of the module from the cage, the paddle member comprising a rear surface that is adapted to further aid in removal of the module from the cage; and
a module cage that is adapted to receive the removable storage member, the module cage including a front flange having a rear surface against which the front surface of the latch tooth is urged during insertion of the module and a front surface against which the rear surface of the paddle is urged during removal of the module, a rear flange positioned inward of the front flange having a front surface against which the rear surface of the latch tooth is urged during removal of the module, and a spring member that applies force to the latch tooth of the module during its operation to stabilize the module.

8. The system of claim 7, wherein the module latch mechanism includes two opposed latch teeth.

9. The system of claim 7, wherein the front surface of the latch tooth comprises a front vertical surface.

10. The system of claim 7, wherein the rear surface of the latch tooth of the latch mechanism comprises a rear oblique surface.

11. The module of claim 7, wherein the spring mechanism of the cage contacts the front surface of the latch tooth of the latch mechanism.

12. A removable storage module, comprising:
a bezel; and
a rail that extends from the bezel, the rail having a proximal end and a distal end, the rail including a light pipe that extends through the rail from its distal end to its proximal end and through the bezel so as to provide an indicator at a front of the bezel, the rail including outwardly extending fingers at the distal end of the rail adjacent the light pipe, the fingers defining a recess in which an end of the light pipe is located and in which a light source within a cage into which the module is inserted can extend so as to position the light source in close proximity to the light pipe.

13. The module of claim 12, wherein the rail comprises two light pipes, each extending to its own recess formed at the distal end of the rail.

14. A removable storage module, comprising:
a bezel having a latch mechanism that is used to facilitate insertion of the module into a module cage and removal of the module from the module cage, the latch mechanism including a latch arm that is used to rotate the mechanism about an axis, a latch tooth that is used to urge the module into and out of the cage, and a paddle member that is used to urge the module out of the cage;
first and second rails that extend from the bezel, each rail including a proximal end and a distal end, the distal end of the first rail including a plurality of key slots that are adapted to receive keys of the module cage, at least one of the key slots being blocked by a stop so as to define a key arrangement that determines what cage bays the module can be inserted into, the second rail including light pipes that extend from a distal end of the second rail to a front of the bezel, the second rail further including pockets provided adjacent ends of the light pipes at the distal end of the second rail, the pocket being adapted to receive light sources of the cage;
a storage device that is mounted between the first and second rails, the storage device comprising storage media; and
a cover that extends between the first and second rails and that protects the storage device.

* * * * *